(12) United States Patent
Wang et al.

(10) Patent No.: US 8,730,662 B2
(45) Date of Patent: May 20, 2014

(54) SERVER RACK SYSTEM

(75) Inventors: Shi-Feng Wang, Shanghai (CN); Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 443 days.

(21) Appl. No.: 13/171,800

(22) Filed: Jun. 29, 2011

(65) Prior Publication Data

US 2012/0262864 A1    Oct. 18, 2012

(30) Foreign Application Priority Data

Apr. 13, 2011   (CN) .......................... 2011 1 0097505

(51) Int. Cl.
*H05K 5/00* (2006.01)
*H05K 7/00* (2006.01)
*H05K 7/20* (2006.01)
*A47B 77/08* (2006.01)

(52) U.S. Cl.
USPC ............ 361/679.46; 361/679.47; 361/679.48; 361/679.49; 361/679.52; 361/695; 361/689; 361/692; 361/694; 312/236

(58) Field of Classification Search
USPC ........ 361/679.46–679.54, 688–747; 312/236; 454/184
See application file for complete search history.

(56) References Cited

U.S. PATENT DOCUMENTS

| | | | |
|---|---|---|---|
| 2004/0068676 A1* | 4/2004 | Larson et al. ................... | 714/31 |
| 2008/0007909 A1* | 1/2008 | Merkin et al. ................. | 361/685 |
| 2010/0033931 A1* | 2/2010 | Miyazawa et al. ............ | 361/696 |

* cited by examiner

*Primary Examiner* — Jenny L Wagner
*Assistant Examiner* — Jerry Wu
(74) *Attorney, Agent, or Firm* — CKC & Partners Co., Ltd.

(57) ABSTRACT

A server rack system includes a rack, servers, and a heat-dissipating wall. The rack has guiding rails, a front end, and a rear end opposite to the front end. The servers slidably configured on the guiding rails and in the rack are adapted for being moved into or out of the rack from the front end. The heat-dissipating wall is pivoted to the rear end and adapted for being folded against or unfolded away from the rear end. The heat-dissipating wall includes a fan wall. Fans lie on the fan wall. The fans are adapted for sucking cool air, such that the cool air enters the rack from the front end and passes through the servers. Heat exchange between the cool air and the servers is carried out to generate hot air that flows out of the rack through the heat-dissipating wall to dissipate heat of the servers.

10 Claims, 4 Drawing Sheets

SERVER RACK SYSTEM

CROSS-REFERENCE TO RELATED APPLICATION

This application claims the priority benefit of China application serial no. 201110097505.0, filed on Apr. 13, 2011. The entirety of the above-mentioned patent application is hereby incorporated by reference herein and made a part of this specification.

BACKGROUND OF THE INVENTION

1. Field of the Invention

The invention relates to a rack system, and particularly relates to a server rack system.

2. Description of Related Art

A server is the core which serves all the computers in a network system and has the functions of providing network users with discs, printing services, and so forth. Meanwhile, the server allows the users to share the resources in the network. The basic framework of the server is approximately the same as that of an ordinary personal computer and includes a central processing unit (CPU), a memory, and input/output (I/O) equipment, which are connected by a bus inside. Through north bridge chips, the CPU and the memory are connected, and through south bridge chips, the I/O equipment is connected. Based on the structure of a chassis, the development of the server may be roughly divided into three phases: the early tower chassis, the rack mountable chassis characterized by the concentration property, and the blade server characterized by high-density calculation.

The rack server given as an example here has the standard exterior and is used together with the chassis. In other words, the rack server is a tower server having an improved framework and is designed to reduce the space occupied by the server as much as possible. Many specialized network equipment adopts the rack mountable structure, which is mostly a flat-type structure shaped as a drawer. The aforesaid network equipment includes exchangers, routers, hardware firewalls, etc, for instance. The width of the rack server is 19 inches, and the height of the rack server is measured by the unit U (1 U=1.75 inches=44.45 millimeters). In general, the standard server has the height of 1 U, 2 U, 3 U, 4 U, 5 U, or 7 U.

The size of the chassis is also regulated by industrial standards, generally from 22 U to 42 U. Detachable sliding trays are configured in the chassis based on the height (U) of the chassis. The user may flexibly adjust the height of the chassis according to the height of the server for storing network equipment, such as the server, a hub, a disc array cabinet, and so forth. After the server is placed, all the I/O wires thereof are led out from the rear of the chassis and organized in the wire trenches of the chassis (all the interfaces of the rack server are also located at the rear). Number labels are commonly used to facilitate management of the wires.

Fans of a conventional rack server are configured in the rack, and thus the dimension of the fans is restricted. Accordingly, only the small-sized fans can be employed, and the heat-dissipating efficiency cannot be effectively improved. Since the small-sized fans often have less favorable heat-dissipating efficiency, more fans are required to be configured in the system for dissipating heat to an acceptable extent, thus increasing costs of equipment.

SUMMARY OF THE INVENTION

The invention is directed to a server rack system that is characterized by favorable heat-dissipating efficiency.

In an embodiment of the invention, a server rack system that includes a rack, a plurality of servers, and a heat-dissipating wall is provided. The rack has a plurality of guiding rails. Besides, the rack has a front end and a rear end opposite to the front end. The servers are slidably configured on the guiding rails respectively and located in the rack. In addition, the servers are adapted for being moved into the rack or moved out of the rack from the front end. The heat-dissipating wall is pivoted to the rear end of the rack and adapted for being folded against the rear end or being unfolded away from the rear end. The heat-dissipating wall includes a fan wall, and a plurality of fans lie on the fan wall. The fans are adapted for sucking cool air, such that the cool air enters the rack from the front end and passes through the servers. Heat exchange between the cool air and the servers is carried out to generate hot air. The hot air flows out of the rack through the heat-dissipating wall, so as to dissipate heat of the servers.

According to an embodiment of the invention, the heat-dissipating wall further includes a water-cooling wall that covers the fan wall. After the hot air generated by the heat exchange between the cool air and the servers flows through the water-cooling wall, the hot air becomes cool air that flows out of the rack.

According to an embodiment of the invention, the water-cooling wall covers an inner side of the fan wall, such that the fans on the fan wall are adapted for being directly hot-plugged when the heat-dissipating wall covers the rear end of the rack.

According to an embodiment of the invention, a side of the heat-dissipating wall is pivoted to the rear end of the rack. A bottom of the water-cooling wall has a water inlet and a water outlet, and the water inlet and the water outlet are adjacent to the side of the heat-dissipating wall pivoted to the rear end.

According to an embodiment of the invention, the heat-dissipating wall extends along the rear end of the rack vertically, and the fans are distributed all over the fan wall.

According to an embodiment of the invention, the server rack system further includes a power transmission module and a power supply module. The power transmission module includes at least one first conductive pillar and at least one second conductive pillar. The first and second conductive pillars are configured in the rack and located at the rear end of the rack. Besides, the first and second conductive pillars are respectively extended from a top of the rack to a bottom of the rack. Here, the first conductive pillar is electrically connected to an external power supply. The power supply module is slidably configured on one of the guiding rails and located in the rack. Here, the power supply module is adapted for being moved into the rack or moved out of the rack from the front end. When the power supply module and the servers are located in the rack, the power supply module is electrically connected to the first and second conductive pillars, the servers are electrically connected to the second conductive pillar respectively, the external power supply transmits high-voltage direct-current (DC) electric power to the power supply module through the first conductive pillar, and the power supply module converts the high-voltage DC electric power into low-voltage DC electric power and transmits the low-voltage DC electric power into the servers through the second conductive pillar.

According to an embodiment of the invention, a plurality of metal elastic tabs are configured at a back side of the power supply module. When the power supply module is slidably configured in the rack, the power supply module is in contact with the first and second conductive pillars through the metal elastic tabs, such that the power supply module is electrically connected to the first and second conductive pillars.

According to an embodiment of the invention, at least one metal elastic tab is configured at a back side of each of the servers. When each server is slidably configured in the rack, each server is in contact with the second conductive pillar through the metal elastic tab, such that each server is electrically connected to the second conductive pillar.

According to an embodiment of the invention, the server rack system further includes a plurality of input/output (I/O) interfaces which respectively correspond to the guiding rails and are fixed at the rear end of the rack. A connector is configured at a back side of each of the servers. When the servers are slidably configured in the rack, the connectors are electrically connected to the I/O interfaces respectively, and the servers communicate with one another through the I/O interfaces.

According to an embodiment of the invention, the server rack system further includes a management module that is slidably configured on one of the guiding rails and located in the rack. A connector is configured at a back side of the management module. When the management module is slidably configured in the rack, the connector is electrically connected to a corresponding one of the I/O interfaces, and the management module manages the servers through the I/O interfaces and collectively manages an operation condition of the heat-dissipating wall based on an operation condition of the servers.

To sum up, the heat-dissipating wall is pivoted to the rear end of the rack, and the fans are configured on the heat-dissipating wall according to the embodiments of the invention. The fans are not configured in the rack, and therefore the dimensions of the fans are not restrained. Namely, large-sized fans can be employed to improve the heat-dissipating efficiency. Since the large-sized fans often have favorable heat-dissipating efficiency, less fans are required to be configured in the server rack system for dissipating heat to an acceptable extent, thus reducing costs of equipment.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
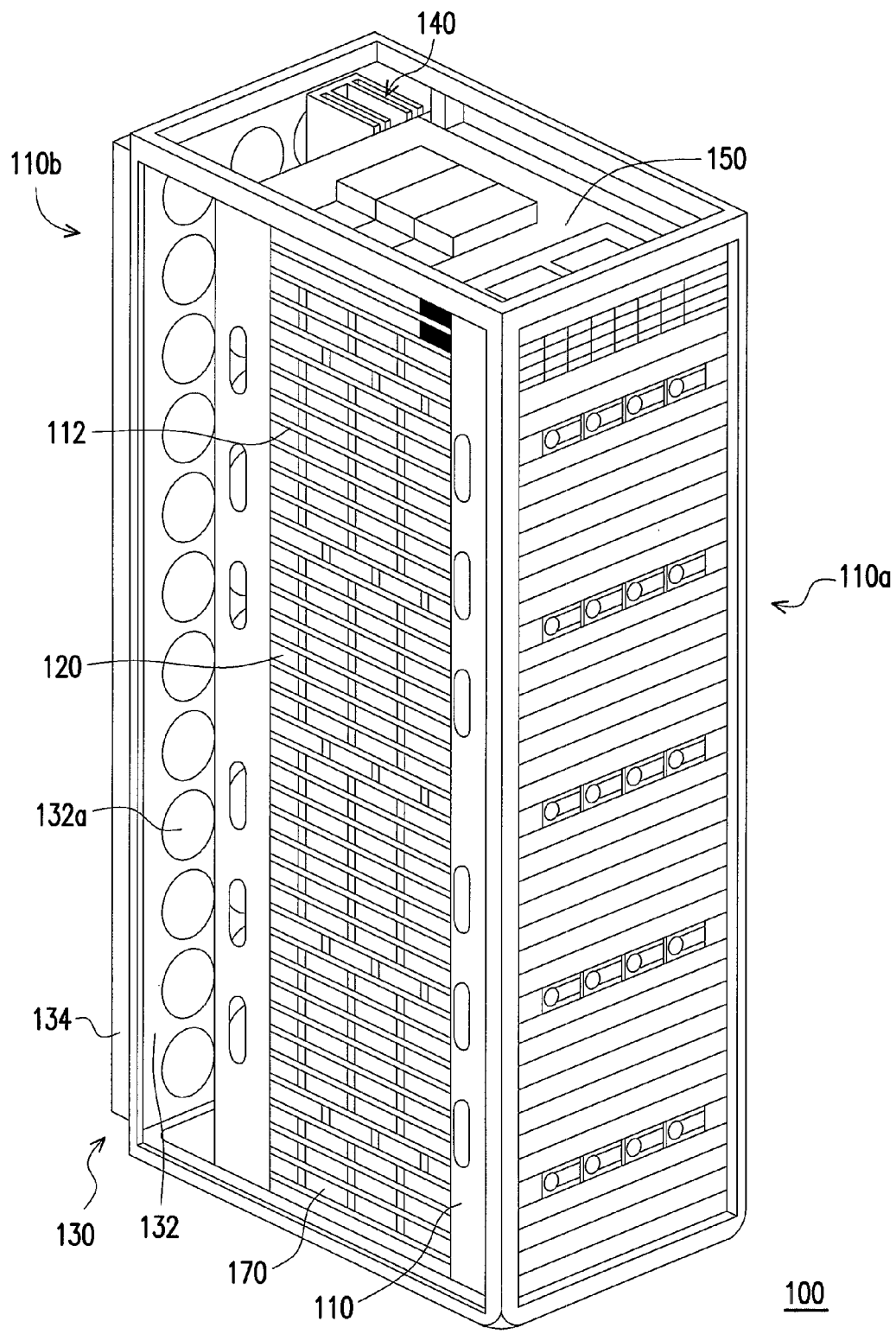
FIG. 1 is a three-dimensional view illustrating a server rack system according to an embodiment of the invention.
Figure 2:
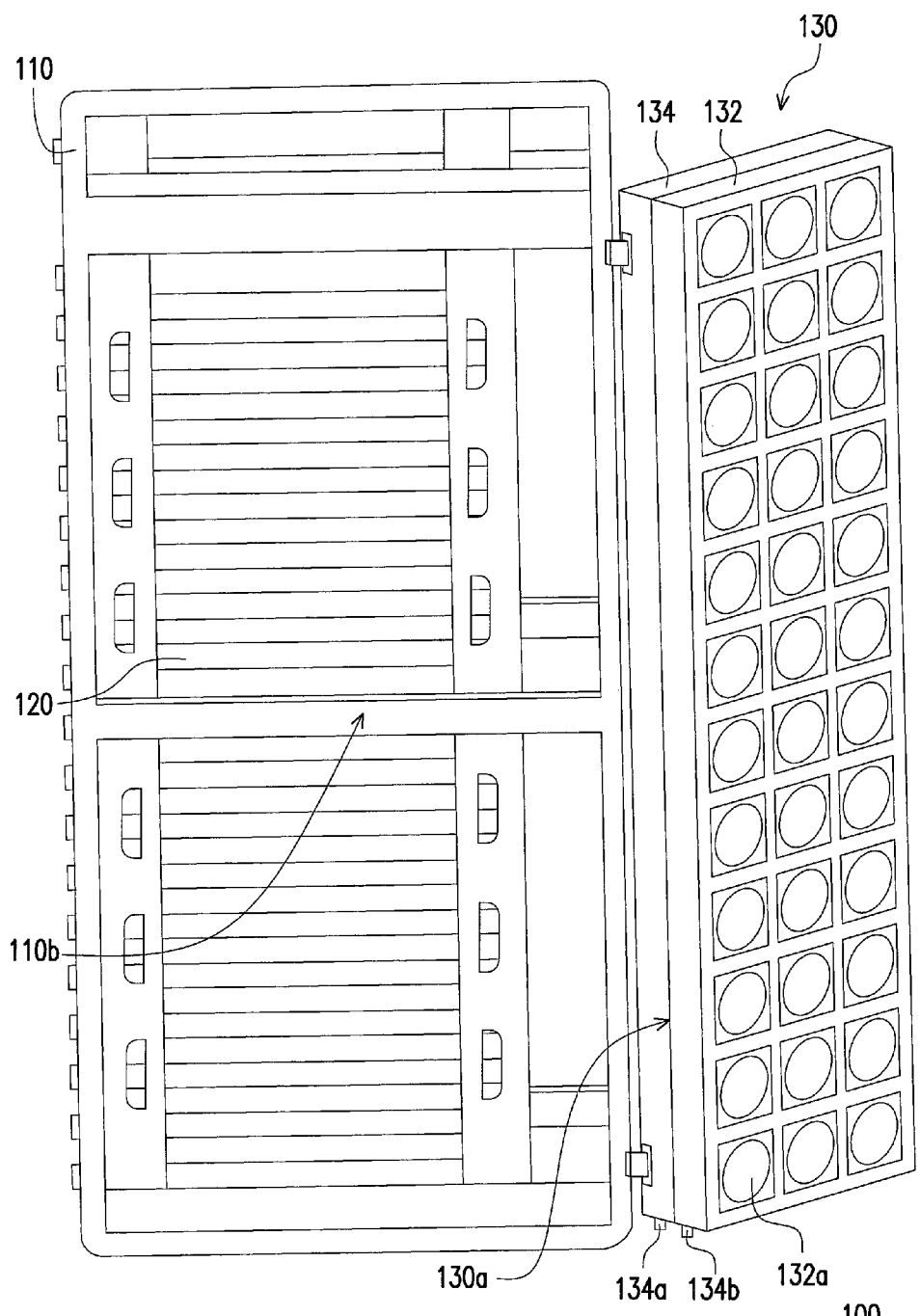
FIG. 2 is a three-dimensional view illustrating that the heat-dissipating wall depicted in FIG. 1 is unfolded away from the rack.

FIG. 1 is a three-dimensional view illustrating a server rack system according to an embodiment of the invention. FIG. 2 is a three-dimensional view illustrating that the heat-dissipating wall depicted in FIG. 1 is unfolded away from the rack. With reference to FIG. 1 and FIG. 2, the server rack system 100 of this embodiment includes a rack 110, a plurality of servers 120, and a heat-dissipating wall 130. The rack 110 has a plurality of guiding rails 112. Besides, the rack 110 has a front end 110a and a rear end 110b opposite to the front end 110a. The servers 120 are slidably configured on the guiding rails 112 respectively and located in the rack 110. Besides, the servers 120 are adapted for being moved into the rack 110 or moved out of the rack 110 from the front end 110a. The heat-dissipating wall 130 is pivoted to the rear end 110b and adapted for being folded against the rear end 110b or being unfolded away from the rear end 110b. The heat-dissipating wall 130 includes a fan wall 132, and a plurality of fans 132a lie on the fan wall 132. The fans 132a are adapted for sucking cool air, such that the cool air enters the rack 110 from the front end 110a and passes through the servers 120. Heat exchange between the cool air and the servers 120 is carried out to generate hot air. The hot air flows out of the rack 110 through the heat-dissipating wall 130, so as to dissipate heat of the servers 120.

As described above, the fans 132a are not configured in the rack 110, and therefore the dimension of the fans 132a is not restrained. Namely, large-sized fans can be employed to improve the heat-dissipating efficiency. Since the large-sized fans often have favorable heat-dissipating efficiency, less fans 132a are required to be configured in the system for dissipating heat to an acceptable extent, thus reducing costs of equipment.

To be more specific, in this embodiment, the heat-dissipating wall 130 further includes a water-cooling wall 134. The water-cooling wall 134 covers the fan wall 132. Hot air generated by the heat exchange between the cool air and the servers 120 flows through the water-cooling wall 134 to generate cool air, and the cool air flows out of the rack 110 to further improve the heat-dissipating efficiency. According to this embodiment, the water-cooling wall 134 covers an inner side of the fan wall 132, such that the fans 132a on the fan wall 132 are adapted for being directly hot-plugged when the heat-dissipating wall 130 covers the rear end 110b.

As indicated in FIG. 2, in this embodiment, a side 130a of the heat-dissipating wall 130 is pivoted to the rear end 110b of the rack 110, a bottom of the water-cooling wall 134 has a water inlet 134a and a water outlet 134b, and the water inlet 134a and the water outlet 134b are adjacent to the side 130a of the heat-dissipating wall 130 pivoted to the rear end 110b. The water inlet 134a and the water outlet 134b are configured adjacent to the rotating shaft of the heat-dissipating wall 130. Hence, when the heat-dissipating wall 130 is being pivoted, the movement of the water inlet 134a and the water outlet 134b can be limited within a certain range, so as to ensure that the water inflow and outflow efficiency is favorable.

In this embodiment, the heat-dissipating wall 130 extends along the rear end 110b of the rack 110 vertically, and the fans 132a are distributed all over the fan wall 132, so as to dissipate heat of all of the servers 120. Besides, when the heat-dissipating wall 130 is unfolded away from the rear end 110b of the rack 110, as shown in FIG. 2, installation or maintenance of the server rack system 100 can be performed via the rear end 110b of the rack 110. Namely, it is rather convenient to install components into the server rack system 100 or maintain the server rack system 100 when the heat-dissipating wall 130 is unfolded away from the rear end 110b.

Figure 3:
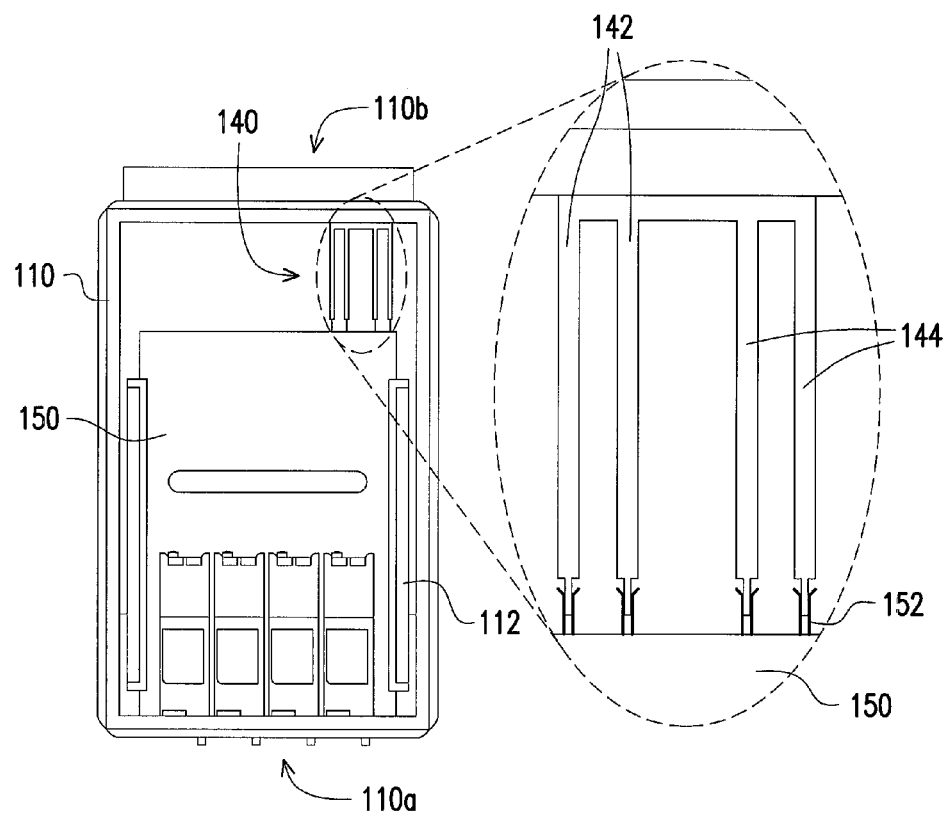
FIG. 3 is a top view illustrating some components in the server rack system depicted in FIG. 1.
Figure 4:
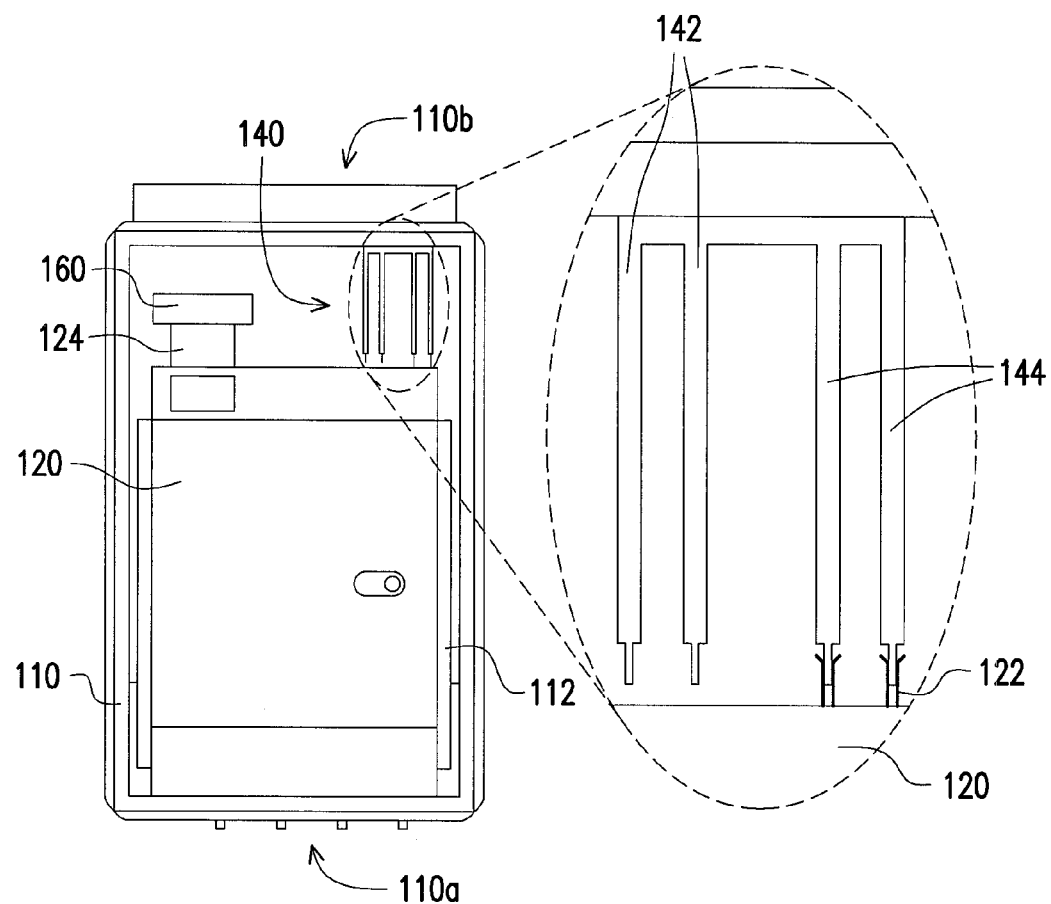
FIG. 4 is a top view illustrating some components in the server rack system depicted in FIG. 1.

FIG. 3 is a top view illustrating some components in the server rack system depicted in FIG. 1. FIG. 4 is a top view illustrating some components in the server rack system depicted in FIG. 1. With reference to FIG. 1, FIG. 3, and FIG.

4, in this embodiment, the server rack system 100 further includes a power transmission module 140 and a power supply module 150. The power transmission module 140 includes at least one first conductive pillar 142 and at least one second conductive pillar 144. In the drawings, two first conductive pillars 142 and two second conductive pillars 144 are shown. The first and second conductive pillars 142 and 144 are configured in the rack 110 and located at the rear end 110b. Besides, the first and second conductive pillars 142 and 144 are respectively extended from a top of the rack 110 to a bottom of the rack 110. Here, the first conductive pillars 142 are electrically connected to an external power supply. The power supply module 150 is slidably configured on one of the guiding rails 112 and located in the rack 110. Additionally, the power supply module 150 is suitable for being moved into or moved out of the rack 110 from the front end 110a. In FIG. 1, the power supply module 150 is slidably configured on the topmost guiding rail 112.

When the power supply module 150 and the servers 120 are located in the rack 110, the power supply module 150 is electrically connected to the first and second conductive pillars 142 and 144, as shown in FIG. 3, and the servers 120 are electrically connected to the second conductive pillars 144 respectively, as shown in FIG. 4. At this time, the external power supply can transmit high-voltage DC electric power to the power supply module 144 through the first conductive pillars 142, and the power supply module 144 converts the high-voltage DC electric power into low-voltage DC electric power and transmits the low-voltage DC electric power to the servers 120 through the second conductive pillars 144, so as to supply power to the servers 120. Thereby, less cables are required in the server rack system 100, and thus the cables can be easily organized. Moreover, air circulation in the server rack system 100 is improved, and so is the heat-dissipating efficiency. Sufficient space is left at the rear end 110b of the rack 110 in the server rack system 100 for configuring the heat-dissipating wall 130.

With reference to FIG. 3, specifically, a plurality of metal elastic tabs 152 are configured at a back side of the power supply module 150 in this embodiment. When the power supply module 150 is slidably configured in the rack 110, the power supply module 150 is in contact with the first and second conductive pillars 142 and 144 through the metal elastic tabs 152, such that the power supply module 150 is electrically connected to the first and second conductive pillars 142 and 144. With reference to FIG. 4, in this embodiment, a plurality of metal elastic tabs 122 are configured at a back side of each of the servers 120. When each server 120 is slidably configured in the rack 110, each server 120 is in contact with the second conductive pillars 144 through the metal elastic tabs 122, such that each server 120 is electrically connected to the second conductive pillars 144.

As indicated in FIG. 4, the server rack system 100 of this embodiment further includes a plurality of I/O interfaces 160. Note that only one I/O interface 160 is depicted in FIG. 4. The I/O interfaces 160 respectively correspond to the guiding rails 112 and are fixed at the rear end 110b of the rack 110. A connector 124 is configured at the back side of each server 120. When the servers 120 are slidably configured in the rack 110, the connectors 124 are electrically connected to the I/O interfaces 160 respectively, such that the servers 120 are adapted for communicating with one another through the I/O interfaces 160.

Figure 5:
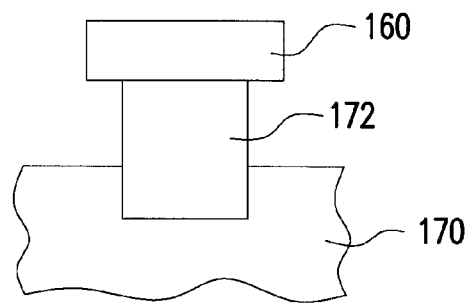
FIG. 5 is a partial top view illustrating the management module depicted in FIG. 1.

With reference to FIG. 1, in this embodiment, the server rack system 100 further includes a management module 170. The management module 170 is slidably configured on one of the guiding rails 112 and located in the rack 110. In FIG. 1, the management module 170 is slidably configured on the bottommost guiding rail 112. FIG. 5 is a partial top view illustrating the management module depicted in FIG. 1. With reference to FIG. 5, a connector 172 is configured at the back side of the management module 170. When the management module 170 is slidably configured in the rack 110, as shown in FIG. 1, the connector 172 is electrically connected to a corresponding one of the I/O interfaces 160, such that the management module 170 is adapted for managing the servers 120 through the I/O interfaces 160 and collectively managing the operation condition of the heat-dissipating wall 130 based on the operation condition of the servers 120.

In light of the foregoing, the heat-dissipating wall is pivoted to the rear end of the rack, and the fans are configured on the heat-dissipating wall according to the embodiments of the invention. The fans are not configured in the rack, and therefore the dimension of the fans is not restrained. Namely, large-sized fans can be employed to improve the heat-dissipating efficiency. Since the large-sized fans often have favorable heat-dissipating efficiency, less fans are required to be configured in the system for dissipating heat to an acceptable extent, thus reducing costs of equipment. Moreover, when the heat-dissipating wall is unfolded away from the rear end of the rack, installation or maintenance of the server rack system can be performed via the rear end of the rack. Namely, it is rather convenient to install components into the server rack system or maintain the server rack system when the heat-dissipating wall is unfolded away from the rear end.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:

1. A server rack system comprising:
   a rack having a plurality of guiding rails, a front end, and a rear end opposite to the front end;
   a plurality of servers slidably configured on the guiding rails respectively and located in the rack, the servers being adapted for being moved into the rack or moved out of the rack from the front end;
   a heat-dissipating wall pivoted to the rear end and adapted for being folded against the rear end or being unfolded away from the rear end, the heat-dissipating wall comprising a fan wall, a plurality of fans lying on the fan wall, the fans being adapted for sucking cool air, such that the cool air enters the rack from the front end and passes through the servers, heat exchange between the cool air and the servers being carried out to generate hot air, the hot air flowing out of the rack through the heat-dissipating wall to dissipate heat of the servers;
   a power transmission module comprising at least one first conductive pillar and at least one second conductive pillar, the at least one first conductive pillar and the at least one second conductive pillar being configured in the rack, located at the rear end, and respectively extended from a top of the rack to a bottom of the rack, wherein the at least one first conductive pillar being electrically connected to an external power supply and;
   a power supply module slidably configured on one of the guiding rails and located in the rack, the power supply module being adapted for being moved into the rack or moved out of the rack from the front end, wherein when the power supply module and the servers are located in the rack, the power supply module is electrically connected to the at least one first conductive pillar and the at least one second conductive pillar, the servers are electrically connected to the at least one second conductive pillar.

2. The server rack system as recited in claim 1, the heat-dissipating wall further comprising a water-cooling wall, the water-cooling wall covering the fan wall, wherein after the hot air generated by the heat exchange between the cool air and the servers flows through the water-cooling wall, the hot air becomes cool air flowing out of the rack.

3. The server rack system as recited in claim 2, wherein the water-cooling wall covers an inner side of the fan wall, such that the fans on the fan wall are adapted for being directly hot-plugged when the heat-dissipating wall covers the rear end.

4. The server rack system as recited in claim 2, wherein a side of the heat-dissipating wall is pivoted to the rear end, a bottom of the water-cooling wall has a water inlet and a water outlet, and the water inlet and the water outlet are adjacent to the side of the heat-dissipating wall pivoted to the rear end.

5. The server rack system as recited in claim 1, wherein the heat-dissipating wall extends along the rear end of the rack vertically, and the fans are distributed all over the fan wall.

6. The server rack system as recited in claim 1, wherein the external power supply transmits high-voltage direct-current electric power to the power supply module through the at least one first conductive pillar, and the power supply module converts the hid-voltage direct-current electric power into low-voltage direct-current electric power and transmits the low-voltage direct-current electric power to the servers through the at least one second conductive pillar.

7. The server rack system as recited in claim 1, a plurality of metal elastic tabs being configured at a back side of the power supply module, wherein when the power supply module is slidably configured in the rack, the power supply module is in contact with the at least one first conductive pillar and the at least one second conductive pillar through the metal elastic tabs, such that the power supply module is electrically connected to the at least one first conductive pillar and the at least one second conductive pillar.

8. The server rack system as recited in claim 1, at least one metal elastic tab being configured at a back side of each of the servers, wherein when the each of the servers is slidably configured in the rack, the each of the servers is in contact with the at least one second conductive pillar through the at least one metal elastic tab, such that the each of the servers is electrically connected to the at least one second conductive pillar.

9. The server rack system as recited in claim 1, further comprising a plurality of input/output interfaces respectively corresponding to the guiding rails and fixed at the rear end of the rack, a connector being configured at a back side of each of the servers, wherein when the servers are slidably configured in the rack, the connectors are electrically connected to the input/output interfaces respectively, and the servers communicate with one another through the input/output interfaces.

10. The server rack system as recited in claim 9, further comprising a management module slidably configured on one of the guiding rails and located in the rack, a connector being configured at a hack side of the management module, wherein when the management module is slidably configured in the rack, the connector is electrically connected to a corresponding one of the input/output interfaces, and the management module manages the servers through the input/output interfaces and collectively manages an operation condition of the heat-dissipating wall based on an operation condition of the servers.

\* \* \* \* \*